(12) United States Patent
Murata

(10) Patent No.: US 7,040,817 B2
(45) Date of Patent: May 9, 2006

(54) THREE-DIMENSIONAL MOUNTED ASSEMBLY AND OPTICAL TRANSMISSION DEVICE

(75) Inventor: Akihiro Murata, Takane-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/185,713

(22) Filed: Jul. 21, 2005

(65) Prior Publication Data

US 2005/0271330 A1 Dec. 8, 2005

Related U.S. Application Data

(62) Division of application No. 09/834,614, filed on Apr. 16, 2001, now Pat. No. 6,945,707.

(30) Foreign Application Priority Data

Apr. 21, 2000 (JP) .............................. 2000-120344

(51) Int. Cl.
*G02B 6/36* (2006.01)
(52) U.S. Cl. .......................... 385/89; 385/88; 385/90; 385/91; 385/92; 385/147; 385/31; 385/14; 385/28; 385/52; 385/76; 385/126; 385/130; 385/132

(58) Field of Classification Search ............ 385/88–92, 385/147, 126, 130, 132
See application file for complete search history.

(56) References Cited

U.S. PATENT DOCUMENTS

| | | | |
|---|---|---|---|
| 5,118,458 A | 6/1992 | Nishihara et al. ............ 264/155 |
| 5,337,388 A | 8/1994 | Jacobowitz et al. .......... 385/76 |
| 5,522,002 A | 5/1996 | Chun et al. .................... 385/88 |
| 6,034,821 A | 3/2000 | Schenfeld et al. .......... 359/618 |

FOREIGN PATENT DOCUMENTS

| | | |
|---|---|---|
| JP | 64-084694 | 3/1989 |
| JP | 02-028992 | 1/1990 |
| JP | 05-007066 | 1/1993 |
| JP | 08-204315 | 8/1996 |
| JP | 10-115734 | 5/1998 |
| JP | 11-068254 | 3/1999 |
| JP | 11-231162 | 8/1999 |
| KR | 1994-0009176 | 1/1994 |

*Primary Examiner*—Andrew Schechter
*Assistant Examiner*—George Y. Wang
(74) *Attorney, Agent, or Firm*—Oliff & Berridge, PLC

(57) ABSTRACT

A three-dimensional mounted assembly includes a molded body, a plurality of electronic parts sealed with the molded body, a plurality of interconnections electrically connected to the electronic parts and sealed with the molded body wherein part of at least one of the interconnections is exposed on a first side of the molded body and at least another one of the interconnections is exposed on a second side of the molded body differing from the first side.

10 Claims, 9 Drawing Sheets

THREE-DIMENSIONAL MOUNTED ASSEMBLY AND OPTICAL TRANSMISSION DEVICE

This is a Division of Application No. 09/834,614 filed Apr. 16, 2001 now U.S. Pat. No. 6,945,707. The entire disclosure of the prior application is hereby incorporated by reference herein in its entirety.

Japanese patent application no. 2000-120344, filed Apr. 21, 2000, is hereby incorporated by reference in its entirety.

BACKGROUND

The present invention relates to a three-dimensional mounted assembly, a method of manufacturing the same, and an optical transmission device.

In recent years, miniaturization of electronic parts has progressed. To deal with this trend, three-dimensional mounting packages have been developed, for example. Three-dimensional mounting technology proposed so far provides a plurality of chips on a substrate in layers. This technique only layers the chips, therefore any increase in the mounting density is limited.

SUMMARY

A method of manufacturing a three-dimensional mounted assembly comprising the steps of:

disposing a plurality of electronic parts on a mold and providing a plurality of interconnections on the mold;

filling a cavity formed by the mold with a molding material, and sealing the electronic parts and the interconnection with the molding material; and curing the molding material, and removing the mold from the molding material.

A three-dimensional mounted assembly comprising:

a molded body;

a plurality of electronic parts sealed with the molded body; and a plurality of interconnections electrically connected to the electronic parts and sealed with the molded body, wherein part of at least one of the interconnections is exposed on a first side of the molded body, and wherein part of at least another one of the interconnections is exposed on a second side of the molded body differing from the first side.

An optical transmission device comprising:

a plurality of the three-dimensional mounting assemblies as defined in claim 17; and an optical fiber connected to each of the three-dimensional mounting assemblies.

DETAILED DESCRIPTION OF EMBODIMENTS

Figure 1:
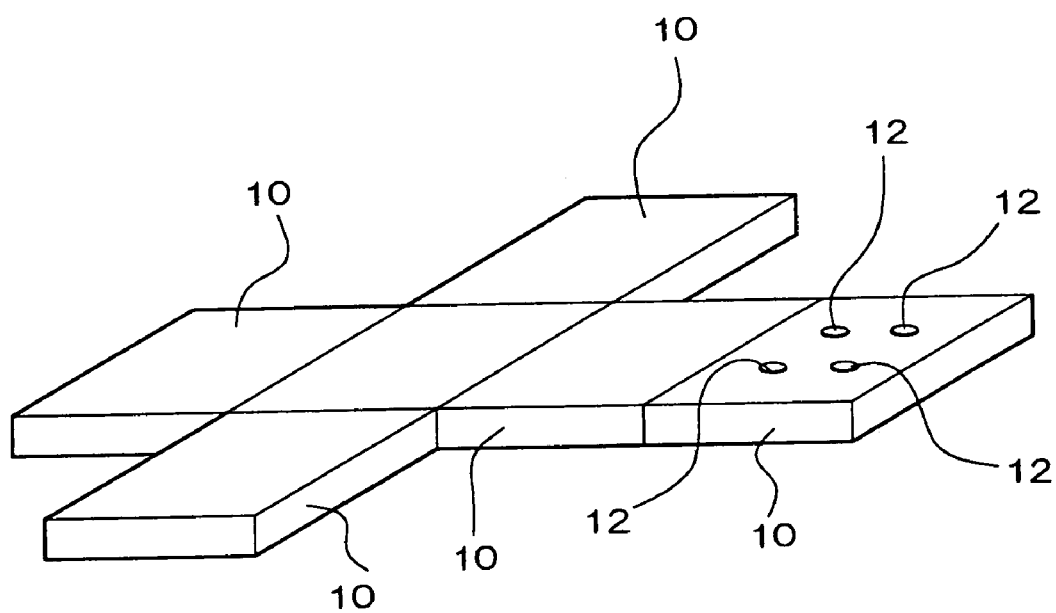
FIG. 1 is a view showing a method of manufacturing a three-dimensional mounted assembly according to a first embodiment to which the present invention is applied.

Embodiments of the present invention are described below. The present invention has been achieved to solve the above-described problem. An objective of the present invention is to provide a three-dimensional mounted assembly with high mounting density, a method of manufacturing the same, and an optical transmission device.

(1) A method of manufacturing a three-dimensional mounted assembly according to an embodiment of the present invention comprises the steps of:

disposing a plurality of electronic parts on a mold and providing a plurality of interconnections on the mold;

filling a cavity formed by the mold with a molding material, and sealing the electronic parts and the interconnection with the molding material; and curing the molding material, and removing the mold from the molding material.

According to this embodiment, a plurality of electronic parts are disposed on the mold, a plurality of interconnections are adhered on the mold by bonding, and the electronic parts and the interconnection are sealed with the molding material. A plurality of electronic parts can be mounted in high density in this manner. The surface of the interconnection bonded to the mold is exposed on the molding material by processing the molding material three-dimensionally using the mold and removing the mold from the molding material, whereby external electrical connection can be established. Since the interconnection is buried in the molding material excluding these exposed portions, a projection due to the interconnection is not formed.

(2) In this method of manufacturing a three-dimensional mounted assembly, the mold may have a structure in which the three-dimensional body having the cavity is developed on a plane.

This allows the electronic parts to be disposed on the mold developed on a plane and the interconnection to be adhered to the mold, whereby these steps can be easily carried out.

(3) In this method of manufacturing a three-dimensional mounted assembly, each of the interconnections may include a wire, and both ends of the wire may be bonded to the mold.

According to this feature, a three-dimensional mounted assembly in which the adhering sections of the wire in both ends are exposed with other portions sealed inside the assembly can be obtained. Therefore, since the wire is sealed, cutting of the wire can be prevented.

(4) In this method of manufacturing a three-dimensional mounted assembly, a bonding pad may be formed on the mold in advance, and the wire may be bonded to the bonding pad.

According to this feature, even if the mold is formed of a material to which it is difficult to bond the wire, the wire can be bonded by forming the bonding pad.

(5) In this method of manufacturing a three-dimensional mounted assembly, the electronic parts and the interconnections may be sealed with the molding material with a release agent applied to the mold.

This increases releasability of the molding material from the mold.

(6) In this method of manufacturing a three-dimensional mounted assembly, the mold may have a projection, and a recess, at least part of which is formed by an exposed portion of each of the interconnections, may be formed in the molding material by providing part of each of the interconnections on an upper end surface of the projection.

According to this feature, a structure in which electrical connection between the interconnection and other members is established on the inner surface of the recess can be obtained.

(7) This method of manufacturing a three-dimensional mounted assembly may further comprise a step of filling the recess with a conductive material.

According to this feature, the interconnection and other members can be electrically connected through the conductive material.

(8) In this method of manufacturing a three-dimensional mounted assembly, at least one of the electronic parts may be an optical device, and the optical device may be mounted with an optical section thereof facing the mold, and the optical device may be sealed with the molding material so as to avoid contact with the optical section.

This three-dimensional mounted assembly is used as an optical module by connecting optical fibers.

(9) A three-dimensional mounted assembly according to an embodiment of the present invention comprises:

a molded body;

a plurality of electronic parts sealed with the molded body; and a plurality of interconnections electrically connected to the electronic parts and sealed with the molded body, wherein part of at least one of the interconnections is exposed on a first side of the molded body, and wherein part of at least another one of the interconnections is exposed on a second side of the molded body differing from the first side.

This ensures that external electrical connection is established three-dimensionally.

(10) In this three-dimensional mounted assembly, the molded body may be a rectangular parallelepiped, and the exposed portions of the interconnections may be disposed on a plurality of the sides of the molded body.

(11) In this three-dimensional mounted assembly, the molded body may have a recess, at least part of which is formed by an exposed portion of each of the interconnections.

According to this feature, a structure in which electrical connection between the interconnection and other members is established on the inner surface of the recess can be obtained.

(12) In this three-dimensional mounted assembly, the recess may be filled with a conductive material.

According to this feature, the interconnection and other members can be electrically connected through the conductive material.

(13) In this three-dimensional mounted assembly, each of the electronic parts may be an optical device, and a hole linking an optical section of the optical device may be formed in the molded body.

(14) In this three-dimensional mounted assembly, an optical fiber may be inserted into the hole to form an optical module.

(15) An optical transmission device according to an embodiment of the present invention comprises:

a plurality of the above three-dimensional mounting assemblies; and optical fiber connected to each of the three-dimensional mounting assemblies.

(16) In this optical transmission device, the device may further comprise a plug electrically connected to each of the three-dimensional mounting assemblies.

Embodiments of the present invention are described below with reference to the drawings.

First Embodiment

FIGS. 1 to 6 are views showing a method of manufacturing a three-dimensional mounted assembly according to a first embodiment to which the present invention is applied. In the present embodiment, a plurality of molds 10 shown in FIG. 1 are used.

The planar shape of each mold 10 is rectangular with the surface being flat. The three-dimensional shape of the molds 10 is in the shape of a plate. The planar shape of the molds 10 may be polygonal other than rectangular. The surface of the molds 10 may be curved. At least one projected section or recesses may be formed on the surface. The three-dimensional shape of the molds 10 may not be in the shape of a plate. The molds 10 may be formed of a resin, glass, ceramics, or a metal. Use of silicon enables microfabrication by etching.

Figure 4:
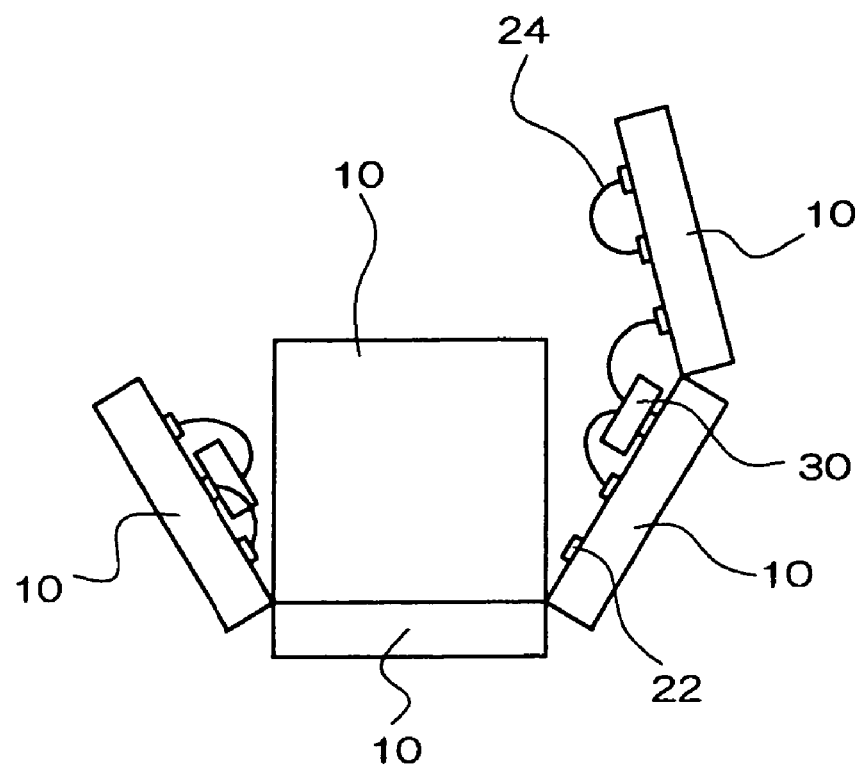
FIG. 4 is a view showing the method of manufacturing a three-dimensional mounted assembly according to the first embodiment to which the present invention is applied.
Figure 5:
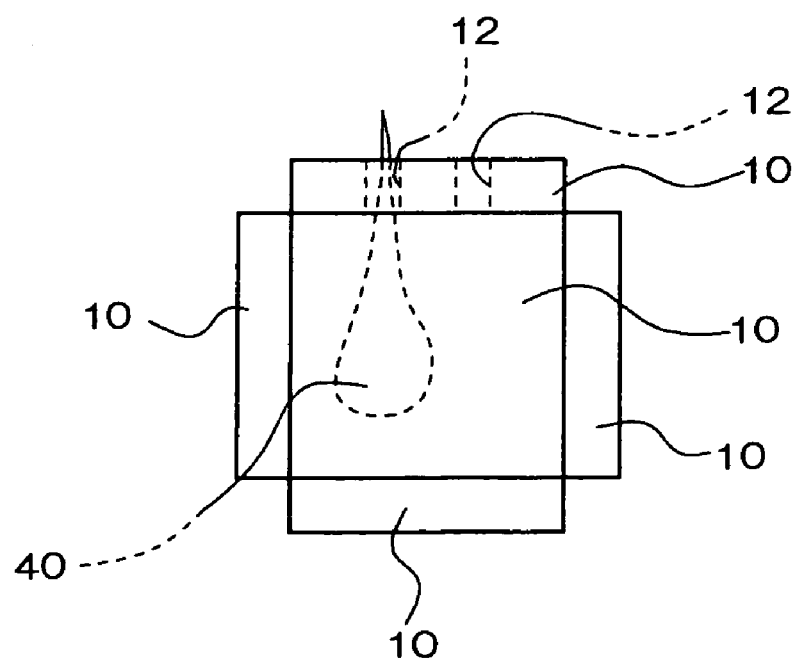
FIG. 5 is a view showing the method of manufacturing a three-dimensional mounted assembly according to the first embodiment to which the present invention is applied.

A plurality of molds 10 may be either separated or interconnected. In the example shown in FIG. 1, the end sections of the molds 10 are connected so as to allow them to be swung around using a flexible member which can be bent, hinges, or the like (see FIG. 4). A plurality of molds 10 are connected so that a container to be filled with a molding material 40 is assembled, as shown in FIGS. 4 and 5. In the example shown in FIG. 1, one of the sides of each mold 10 is connected to one of the sides of other mold 10.

In the case of assembling the molds 10 into a container with a lid (see FIG. 5), at least one hole 12 through which the molding material is injected into the container may be formed through the mold 10 which becomes the lid (the number of holes may be one although a plurality of holes are formed in the example shown in FIG. 1).

In the present embodiment, a plurality of molds 10 are disposed on a plane, as shown in FIG. 1. For example, the molds 10 are developed as if a development of the container to be assembled is drawn.

Figure 2A:
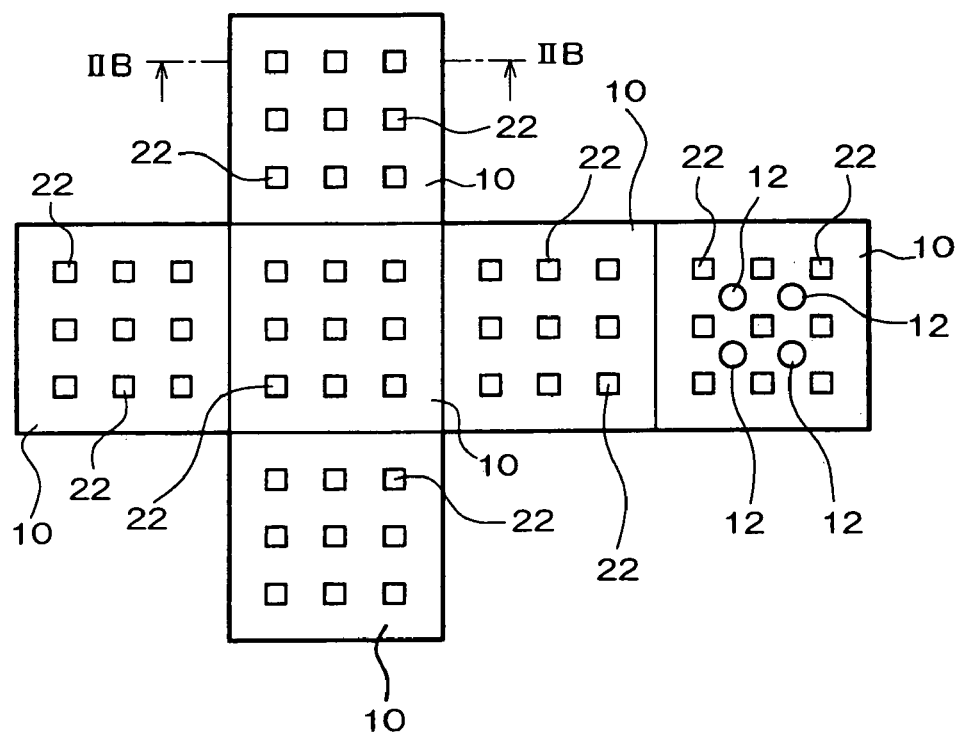
FIGS. 2A and 2B are views showing the method of manufacturing a three-dimensional mounted assembly according to the first embodiment to which the present invention is applied.
Figure 2B:
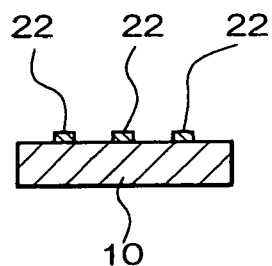
Figure 3:
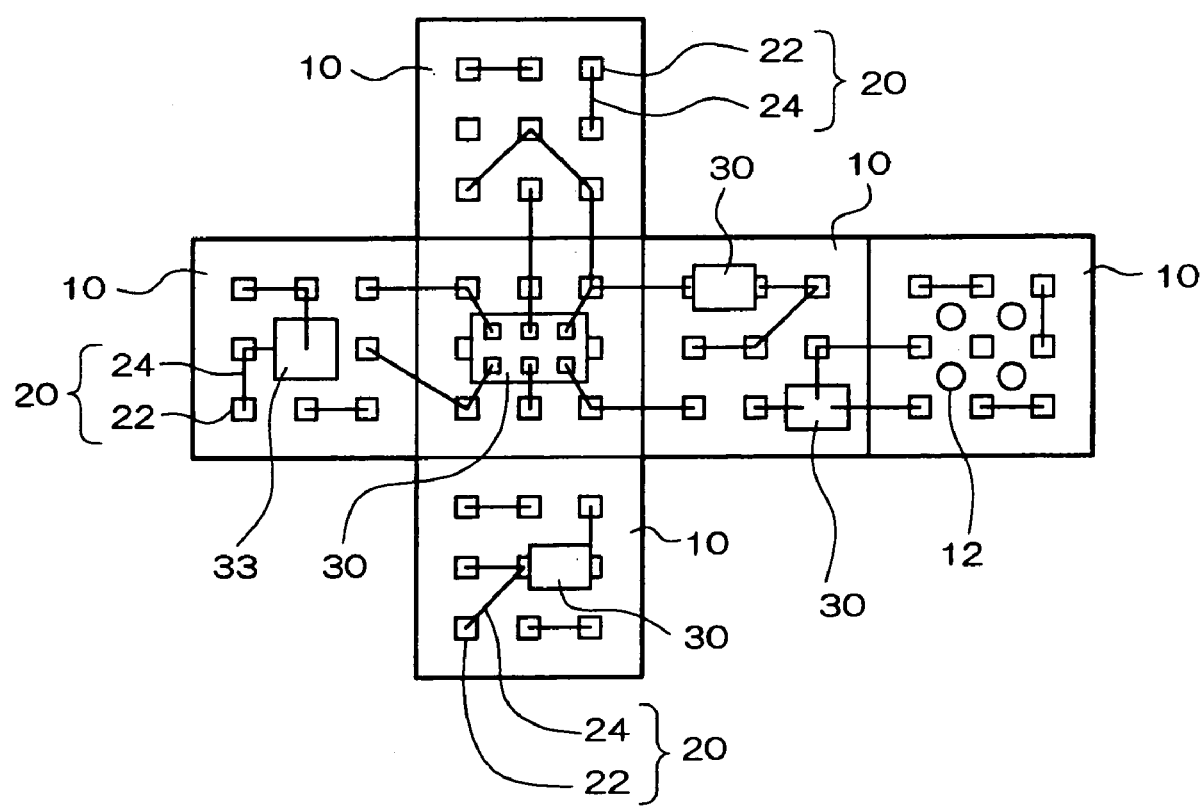
FIG. 3 is a view showing the method of manufacturing a three-dimensional mounted assembly according to the first embodiment to which the present invention is applied.

A plurality of bonding pads 22 are formed on a plurality of the molds 10, as shown in FIGS. 2A and 2B. FIG. 2B is a cross-sectional view along the line IIB—IIB shown in FIG. 2A. Interconnections 20 are formed on the molds 10 by bonding wires 24 to the bonding pads 22, as shown in FIG. 3. Specifically, the interconnections 20 include the bonding pads 22 and the wires 24. The bonding pads 22 may be a conductive film or nonconductive film to which wires can be bonded.

Since it is difficult to bond the wires 24 to the molds 10 formed of silicon or the like, the bonding pads 22 are formed on the molds 10 in advance. The surface of the-bonding pads 22 may be formed using the same material as the wires. In the case where the wires are formed of gold, for example, the bonding pads 22 maybe formed using a chromium film and a gold film formed thereon. The wires 24 may be bonded using a wire bonder used in the manufacture of semiconductor devices. In this case, the wires 24 are bonded using at least one of heat, pressure, and supersonic vibration. The wires may be formed of gold or aluminum.

It is preferable that the interconnections 20 be easily removed from the molds 10. For example, the interconnections 20 can be easily removed from the molds 10 by forming the bonding sections of the interconnections 20 to the molds 10 (bonding pads 22, for example) by plating with tin or the like. In the case of forming the interconnections 20 by printing, the interconnections 20 can be relatively easily removed.

As an example differing from the present embodiment, the interconnections 20 may be formed of a conductive layer formed by vacuum evaporation or plating. In the case of employing electroless plating, catalysts may be jetted out using an ink-jet method. The conductive layer may be formed by employing printing, potting, or an ink-jet method. Conductive paste may be used as the material for the conductive layer.

In the present embodiment, a plurality of bonding sections (bonding pads 22, for example) of a plurality of interconnections 20 are formed on each mold 10. Specifically, the bonding sections (bonding pads 22, for example) are formed on the side of the molds 10 which becomes the inner side of the container to be assembled. A plurality of bonding sections to the molds 10 are disposed in a desired pattern. For example, a plurality of bonding sections (bonding pads 22, for example) are disposed in a matrix in columns and rows, as shown in FIG. 2A. Differing from this example, a plurality of bonding sections may be formed on the molds 10 in a row, or one bonding section may be formed on one mold 10. The bonding section of the interconnection 20 need not be formed on at least one mold 10, and the bonding sections (bonding pads 22, for example) may be formed on other molds 10.

The interconnection 20 is formed with at least one end section (bonding pad 22, for example) bonded to the mold 10. Both end sections of the interconnection 20 may be bonded to one mold 10. One end section of the interconnection 20 may be bonded to one of the molds 10 and the other end section may be bonded to other mold 10. Only one end section of the interconnection 20 may be bonded to the mold 10, and the other end section may be bonded to a part other than the mold 10.

A plurality of electronic parts 30 are mounted on a plurality of molds 10, as shown in FIG. 3. The step of mounting the electronic parts 30 may be carried out after the step of forming the interconnections 20 and vice versa. These steps may also be carried out at the same time.

The electronic parts 30 need not be mounted on all of the molds 10 to be used. Specifically, among a plurality of the molds 10 (six in the example shown in FIG. 3), a plurality of electronic parts 30 may be mounted on a plurality of the molds 10 (five in the example shown in FIG. 3) excluding at least one mold 10. In the example shown in FIG. 3, no electronic part 30 is mounted on the mold 10 in which the holes 12 are formed so as not to close the holes 12. A plurality of the electronic parts 30 may be mounted on each mold 10 or only one electronic part 30 may be mounted on one mold 10. Specifically, a plurality of the electronic parts 30 in total may be mounted on a plurality of the molds 10 in total.

There are no specific limitations to the electronic parts 30. As examples of the electronic parts 30, integrated circuit chips (semiconductor chips, for example), optical devices, resistors, capacitors, coils, oscillators, filters, thermosensors, thermistors, varistors, variable resistors, fuses, cooling parts such as Peltier devices and heat pipes, and the like can be given. In the case of using surface mounting-type parts which are mounted with the side on which the electrodes are formed facing downward as the electronic parts 30, the electrodes may be bonded to the bonding pads 22. The electrodes may be bonded to the interconnection 20. Specifically, the electrodes of the electronic parts 30 may be bonded to the wires 24 bonded to the bonding pads 22. The electronic parts 30 may be disposed so as to avoid the interconnections 20 (bonding pads 22 or wires 24). An insulating film may be formed on the interconnections 20 (bonding pads 22 or wires 24) using a resin or the like, and the electronic parts 30 may be disposed on the insulating film.

The end section of the interconnection 20 (specifically, wires 24) of which the other end section is bonded to the mold 10 may be bonded to the electrodes formed on the top or side of the electronic parts 30. The electrodes of a plurality of the electronic parts 30 may be connected using wires other than the wires 24 (wires which are not bonded to the mold 10).

A release agent (not shown) may be applied to the molds 10, as required. The release agent (lubricant) exhibits low adhesion to a molding material 40 described below. Releasability of the molding material 40 from the molds 10 is improved by applying the release agent.

As shown in FIG. 4, a plurality of molds 10 are assembled into a container. Specifically, the molds 10 are assembled with the interconnections 20 and the electronic parts 30 disposed inside the molds 10. Since a plurality of the molds 10 are disposed three-dimensionally, the electronic parts 30 mounted on the molds 10 are also disposed three-dimensionally.

The container is then filled with the molding material 40, as shown in FIG. 5. In the example shown in FIG. 5, since the molds 10 are assembled into a container with a lid, the molding material 40 is injected through the holes 12 formed in the mold 10 which becomes the lid. In the case where the molding material 40 is injected through one hole 12, for example, out of four holes 12, for example, the three holes 12 may be used as an air vent.

In the case where the molds 10 are assembled into a container without a lid differing from the example shown in FIG. 5, the molding material 40 is injected through the top opening of the container. A resin such as a mold resin may be used as the molding material 40, for example. Either a thermoplastic resin or a thermosetting resin may be used as the resin. Releasability of the molding material 40 from the molds 10 can be improved by adding a release agent to the molding material 40.

The interconnections 20 and the electronic parts 30 are thus sealed with the molding material 40. Since the electronic parts 30 are disposed three-dimensionally, the electronic parts 30 are mounted three-dimensionally. The interconnections 20 formed by bonding the wires 24 are sealed with the mold resin 40, whereby cutting of the wires 24 can be prevented.

The surface of the molding material 40 is processed by a plurality of molds 10. In more detail, the surface of the molding material 40 is processed three-dimensionally by the inner space (cavity) of the container formed by the molds 10. Specifically, part of the surface of the molding material 40 is processed by each mold 10. Since a plurality of molds 10 are disposed three-dimensionally, the molding material 40 is processed three-dimensionally. If projected sections are formed on the molds 10, recesses corresponding to the projected sections are formed in the molding material 40. If recesses are formed in the molds 10, projected sections corresponding to the recesses are formed on the molding material 40.

Figure 6:
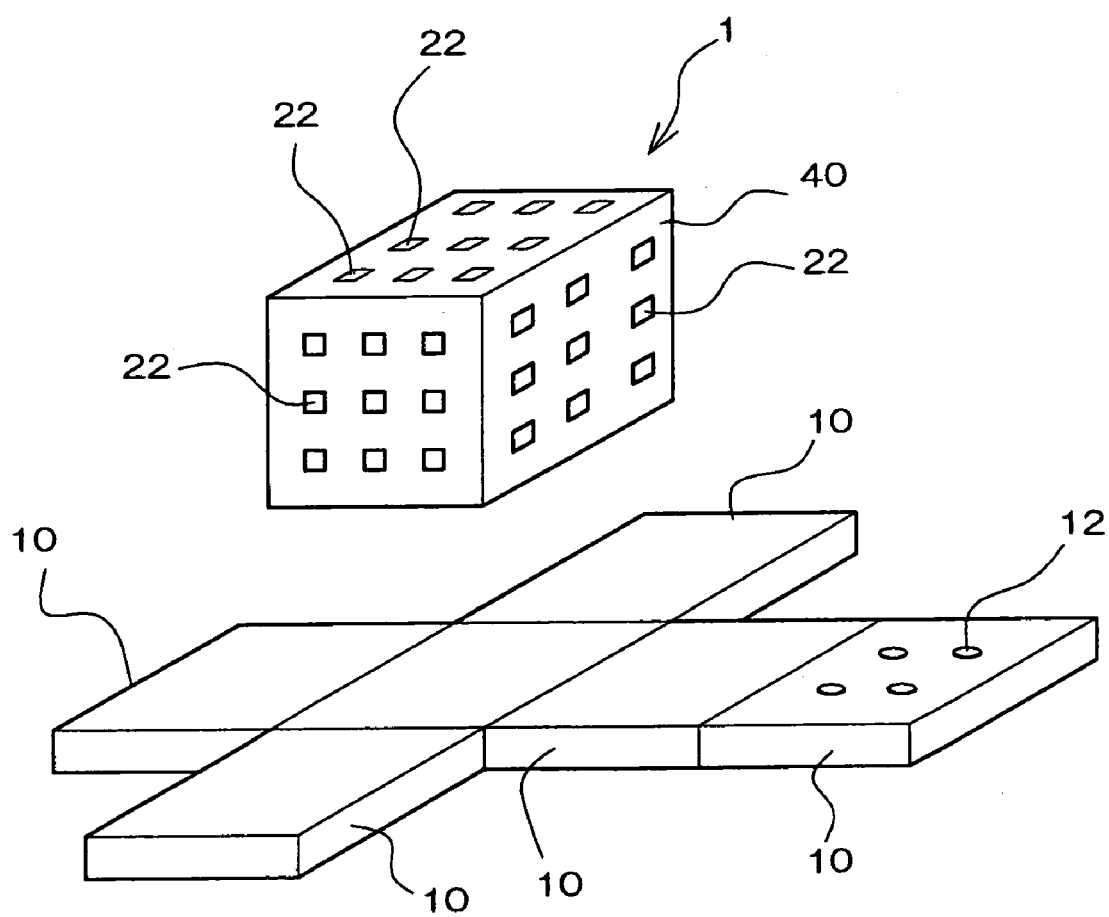
FIG. 6 is a view showing the method of manufacturing a three-dimensional mounted assembly according to the first embodiment to which the present invention is applied.

After curing the molding material 40, the molds 10 are removed from the molding material 40 as shown in FIG. 6, to obtain a three-dimensional mounted assembly 1. The three-dimensional mounted assembly 1 includes a plurality of the electronic parts 30 and the molding material (molded body) 40 with which the electronic parts 30 are sealed as described above. The molded body consisting of the molding material 40 of which the surface shape is processed by the molds 10 may be a rectangular parallelepiped (cube in FIG. 6). Part of the interconnections 20 (bonding pads 22, for example) is exposed on the molded body. These exposed portions (exposed surfaces) become external electrical connection sections. In the example shown in FIG. 6, since the exposed portions of the interconnections 20 are located on a plurality of sides of the molded body (including a first side and a second side differing from the first side), external electrical connection can be established three-dimensionally. Solder balls (not shown) or the like may be formed in the exposed portions of the interconnections 20 and used as external terminals.

According to the present embodiment, since the electronic parts 30 are mounted on the molds 10 and the molding material 40 is processed by the molds 10 three-dimensionally, a plurality of electronic parts 30 can be mounted three-dimensionally in high density. Electrical connection can be established three-dimensionally by forming sections which become external electrical connection sections (exposed portions of the interconnections 20) on a plurality of sides of the three-dimensional mounted assembly 1.

Second Embodiment

Figure 7:
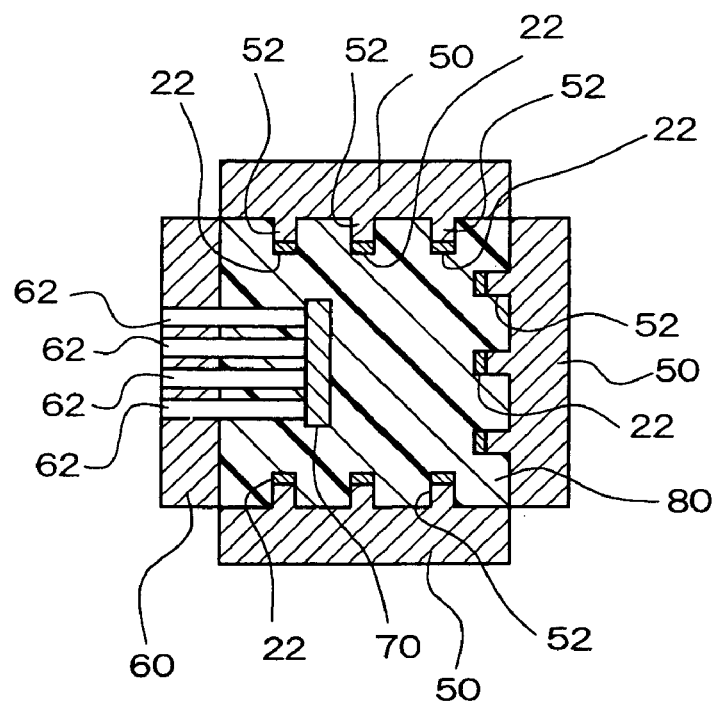
FIG. 7 is a view showing a method of manufacturing a three-dimensional mounted assembly according to a second embodiment to which the present invention is applied.
Figure 8:
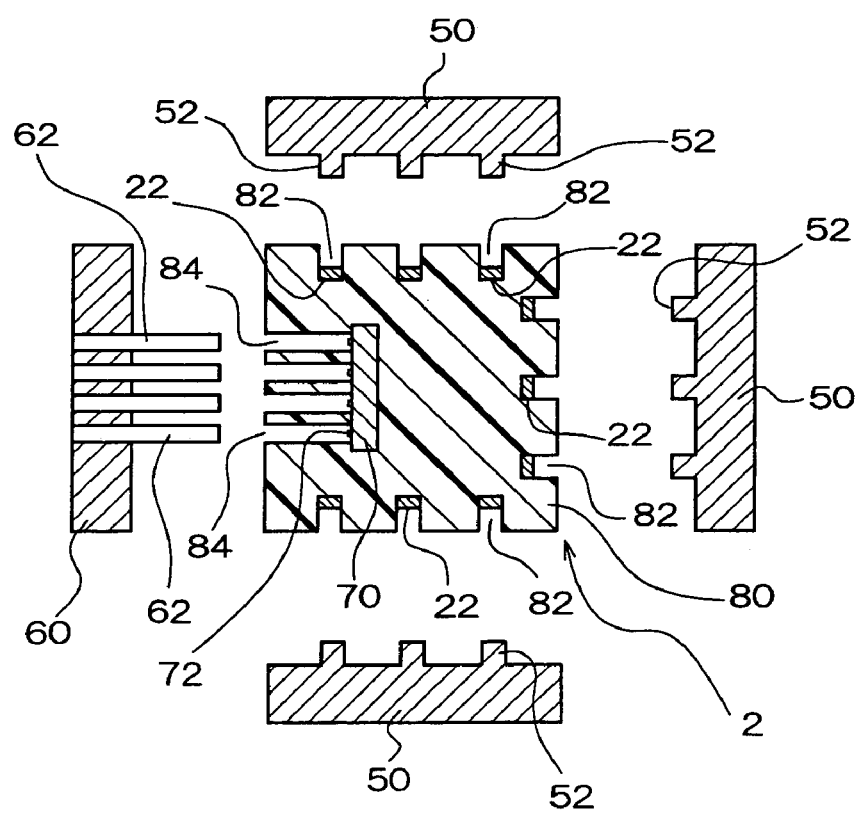
FIG. 8 is a view showing the method of manufacturing a three-dimensional mounted assembly according to the second embodiment to which the present invention is applied.
Figure 9:
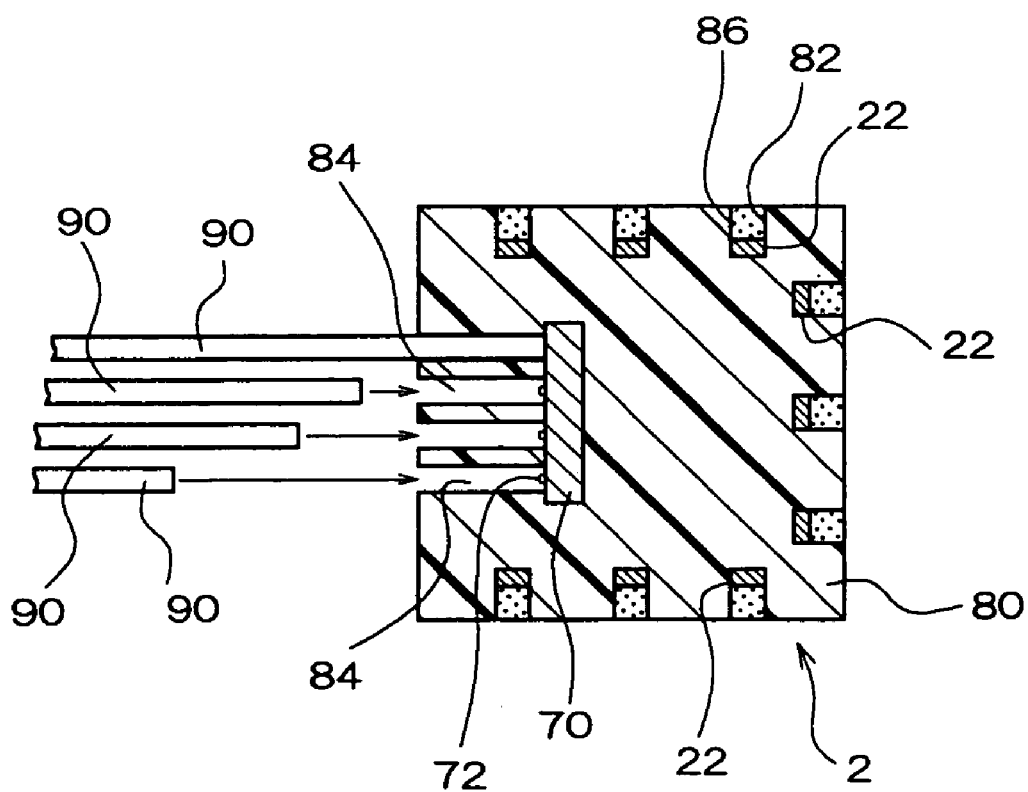
FIG. 9 is a view showing the method of manufacturing a three-dimensional mounted assembly according to the second embodiment to which the present invention is applied.

FIGS. 7 to 9 are views showing a method of manufacturing a three-dimensional mounted assembly according to a second embodiment to which the present invention is applied. In the present embodiment, a plurality of molds 50 and 60 shown in FIG. 7 are used. A plurality of molds 50 and one mold 60 are shown in FIG. 7. Note that one mold 50 and a plurality of molds 60 or a plurality of molds 50 and a plurality of molds 60 may be used insofar as a plurality of molds 50 and 60 in total are used.

The mold 50 has projections 52. The upper ends of the projections 52 are attached to the interconnections 20 (see FIG. 3). In FIG. 7, only the bonding pads 22 which form part of the interconnections 20 are illustrated and the wires 24 are omitted. The description of the interconnections 20 in the first embodiment also applies to the present embodiment.

At least one pin 62 (may be one although a plurality of pins are shown in FIG. 7) is provided in the mold 60. Specifically, the pins 62 are formed so as to stand perpendicularly or slantingly, as required, from the side of the mold 60 for processing the molding material. The pins 62 are formed to have a diameter corresponding to optical fibers described later.

Molds having both of the structures of the molds 50 and 60 may be used. Specifically, the mold 50 may be provided with the pins 62, and the mold 60 may be provided with the projections 52. The description of the molds 10 in the first embodiment applies to other structures of the molds 50 and 60.

The interconnections 20 (bonding pads 22) are provided on the molds 50 and 60. The interconnections 20 are provided on the mold 50 by bonding part of the interconnections 20 (bonding pads 22) to the projections 52 (to the upper end surface, for example). The interconnections 20 may be provided by bonding the interconnections 20 in a region other than the projections 52. The interconnections 20 may be attached to the mold 60 (omitted in FIG. 7). In the case of forming the projections on the mold 60, the interconnections 20 may be provided on the projections.

A plurality of electronic parts 70 are disposed on the molds 50 and 60. The electronic parts may be disposed on the mold 50 (omitted in FIG. 7). An optical device is disposed on the mold 60 as the electronic part 70.

The optical device may be either a light emitting device or a light receiving device. As an example of the light emitting device, a surface-emitting device, in particular, a surface-emitting laser can be used. The surface-emitting device such as the surface-emitting laser emits light from the surface perpendicularly thereto. The optical device has optical sections 72 (see FIG. 8). In the case where the optical device is a light emitting device, the optical sections 72 are light emitting sections. In the case where the optical device is a light receiving device, the optical sections 72 are light receiving sections.

The electronic part 70 as the optical device is disposed with the optical sections 72 (see FIG. 8) facing the pins 62. Recesses may be formed in the end surface of the pins 62 so that the optical sections 72 do not come in contact with the pins 62.

Since other procedures relating to these steps are the same as those described with reference to FIGS. 1 to 3, description thereof is omitted. The steps relating to the procedures described with reference to FIGS. 4 and 5 are carried out. Specifically, a container assembled using the molds 50 and 60 is filled with a molding material 80. The molding material 80 is provided so as to avoid the optical sections 72 of the electronic part 70 as the optical device. The optical sections 72 can be prevented from being covered with the molding material 80 by forming a recesses in the end surface of each pin 62 and disposing the optical section 72 in the recesses, thereby surrounding the optical sections 72 with the circumference section of the recesses.

After curing the molding material 80, the molds 50 and 60 are removed from the molding material 80, as shown in FIG. 8. The molds 50 and 60 are preferably removed along the axis of the projections 52 or the pins 62 so as not to damage the molding material 80.

A three-dimensional mounted assembly 2 is thus obtained. Recesses 82 are formed in the molding material (molded body) 80 by the projections 52 formed on the mold 50. At least part (bottom in FIG. 8) of the recesses 82 is formed by the-bonding pads 22. This also applies to the case of forming the projections on the mold 60. Holes 84 are formed in the molding material 80 by the pins 62 formed in the mold 60. The holes 84 expose the optical sections 72.

The recesses 82 which expose part of the interconnections 20 (bonding pads 22) may be filled with a conductive material 86, as shown in FIG. 9. The conductive material 86 may be a brazing material such as solder or conductive paste. The conductive material 86 shown in FIG. 9 is formed so as not to rise higher than the side in which the recesses 82 are formed. In this case, external terminals may be formed by providing solder balls on the conductive material 86. The external terminals may be formed using the conductive material 86 by causing the conductive material 86 to rise higher than the side in which the recesses 82 are formed.

Optical fibers 90 may be inserted into the holes 84 in the molded body formed of the molding material 80, as shown in FIG. 9. The optical sections 72 of the electronic part 70 (optical device) are located in the holes 84 as described above, whereby the optical sections 72 can be optically connected to the optical fibers 90. An optical module is thus obtained.

The optical fiber 90 includes a core and concentric cladding which encloses the core, in which light is reflected at the boundary between the core and the cladding and transmitted while being confined in the core. The outer surface of the cladding is often protected by a jacket.

It is preferable that the optical fibers 90 not be in contact with the optical sections 72. For example, the optical fibers 90 may be inserted into the holes 84 after filling the holes 84 with a light transmitting resin in advance. This allows the light transmitting resin to be interposed between the optical sections 72 and the end surface of the optical fiber 90, whereby the optical sections 72 can be prevented from being in contact with the optical fibers 90. The optical fiber 90 may be inserted into the hole 84 in an amount less than the depth of the surface of the optical section 72 from the opening of the hole 84. In this case, a stopper may be provided to prevent the optical fiber 90 from being inserted into the hole 84 further than a predetermined depth.

This optical module includes a plurality of optical sections 72 and a plurality of optical fibers 90. Each optical fiber 90 is inserted into the hole 84 corresponding to each optical section 72. The example shown in FIG. 9 is an optical module having four optical sections 72. In the case of using this optical module for transmission of color image signals, the optical sections 72 and the optical fibers 90 are used for transmitting/receiving RGB signals and clock signals.

The present embodiment also exhibits the same effects as described in the first embodiment. According to the present embodiment, an optical module can be manufactured in high density. In the above description, the optical module has one optical device. An optical module having a plurality of optical devices may be manufactured.

Third Embodiment

Figure 10:
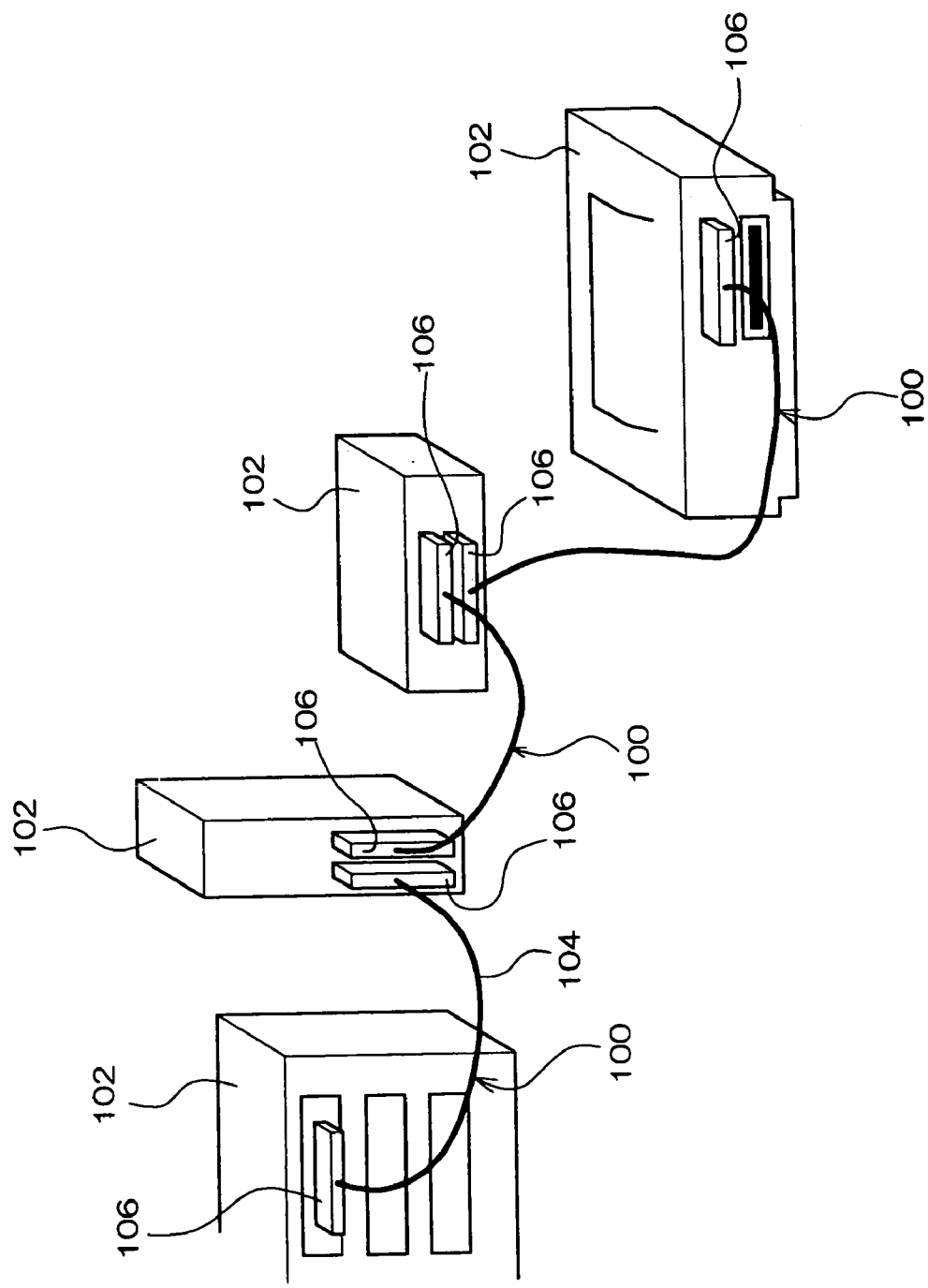
FIG. 10 is a view showing an optical transmission device according to a third embodiment to which the present invention is applied.

FIG. 10 is a view showing an optical transmission device according to a third embodiment to which the present invention is applied. An optical transmission device 100 interconnects each piece of electronic equipment 102 such as computers, displays, storage devices, and printers. The electronic equipment 102 may be information communications equipment.

The optical transmission device 100 may be one in which plugs 106 are provided on both ends of a cable 104. The cable 104 includes at least one optical fiber 90 (see FIG. 2). The above-described three-dimensional mounted-assembly 2 is electrically connected-to the plugs 106.

The electronic part 70 connected to one end section of the optical fiber 90 is a light emitting device. Electric signals output from one piece of electronic equipment 102 are converted into optical signals by the light emitting device. The optical signals are transmitted through the optical fiber 90 and input into the other electronic part 70. This electronic part 70 is a light receiving device which converts the input optical signals into electric signals. The electric signals are input into the other piece of electronic equipment 102. According to the optical transmission device 100 of the present embodiment, information communication between each piece of electronic equipment 102 can be achieved by optical signals.

Fourth Embodiment

Figure 11:
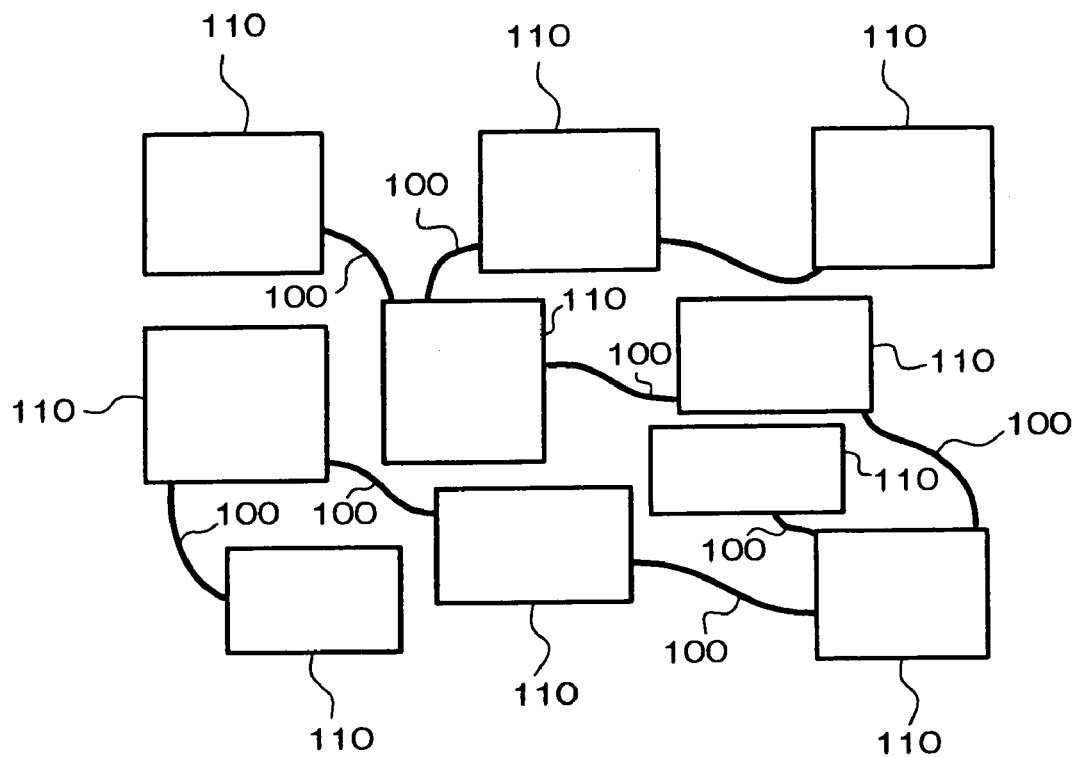
FIG. 11 is a view showing an optical transmission device according to a fourth embodiment to which the present invention is applied.

FIG. 11 is a view showing conditions of use of an optical transmission device according to a fourth embodiment to which the present invention is applied. An optical transmission device 100 interconnects each piece of electronic equipment 110. As examples of the electronic equipment 110, liquid crystal display monitors or digital CRTs (may be used in the field of finance, mail order, medical treatment, and education), liquid crystal projectors, plasma display panels (PDPs), digital TVs, cash registers (for POS (Point of Sale Scanning)) for retail stores, video cassette recorders, tuners, game machines, printers, and the like can be given.

What is claimed:

1. A method of manufacturing a three-dimensional mounted assembly comprising the steps of:
   disposing a plurality of electronic parts on a mold and providing a plurality of interconnections on the mold;
   filling a cavity formed by the mold with a molding material, and sealing the electronic parts and the interconnection with the molding material; and
   curing the molding material, and removing the mold from the molding material.

2. The method of manufacturing a three-dimensional mounted assembly as defined in claim 1,
   wherein the mold has a structure in which the three-dimensional body having the cavity is developed on a plane.

3. The method of manufacturing a three-dimensional mounted assembly as defined in claim 1,
   wherein each of the interconnections includes a wire, and both ends of the wire are bonded to the mold.

4. The method of manufacturing a three-dimensional mounted assembly as defined in claim 3,
   wherein a bonding pad is formed on the mold in advance, and the wire is bonded to the bonding pad.

5. The method of manufacturing a three-dimensional mounted assembly as defined in claim 1,
   wherein the electronic parts and the interconnections are sealed with the molding material with a release agent applied to the mold.

6. The method of manufacturing a three-dimensional mounted assembly as defined in claim 1,
   wherein the mold has a projection, and a recess, at least part of which is formed by an exposed portion of each of the interconnections, is formed in the molding material by providing part of each of the interconnections on an upper end surface of the projection.

7. The method of manufacturing a three-dimensional mounted assembly as defined in claim 5,
   wherein the mold has a projection, and a recess, at least part of which is formed by an exposed portion of each of the interconnections, is formed in the molding material by providing part of each of the interconnections on an upper end surface of the projection.

8. The method of manufacturing a three-dimensional mounted assembly as defined in claim 6, further comprising a step of filling the recess with a conductive material.

9. The method of manufacturing a three-dimensional mounted assembly as defined in claim 7, further comprising a step of filling the recess with a conductive material.

10. The method of manufacturing a three-dimensional mounted assembly as defined in claim 1, wherein at least one of the electronic parts is an optical device, and wherein the optical device is mounted with an optical section thereof facing the mold, and the optical device is sealed with the molding material so as to avoid contact with the optical section.

* * * * *